US010920141B2

(12) United States Patent
Chen et al.

(10) Patent No.: US 10,920,141 B2
(45) Date of Patent: Feb. 16, 2021

(54) COMPOSITIONS AND METHODS FOR SELECTIVELY ETCHING TITANIUM NITRIDE

(71) Applicant: ADVANCED TECHNOLOGY MATERIALS, INC., Danbury, CT (US)

(72) Inventors: Li-Min Chen, Norwalk, CT (US); Steven Lippy, Brookfield, CT (US); Emanuel I Cooper, Scarsdale, NY (US); Lingyan Song, Fort Collins, CO (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 14/896,197

(22) PCT Filed: Jun. 6, 2014

(86) PCT No.: PCT/US2014/041322
§ 371 (c)(1),
(2) Date: Dec. 4, 2015

(87) PCT Pub. No.: WO2014/197808
PCT Pub. Date: Dec. 11, 2014

(65) Prior Publication Data
US 2016/0130500 A1 May 12, 2016

Related U.S. Application Data

(60) Provisional application No. 61/831,928, filed on Jun. 6, 2013.

(51) Int. Cl.
| C09K 13/02 | (2006.01) |
| C11D 7/06 | (2006.01) |
| C11D 3/30 | (2006.01) |
| H01L 21/02 | (2006.01) |
| C11D 3/39 | (2006.01) |
| C11D 3/04 | (2006.01) |
| C11D 3/395 | (2006.01) |
| C11D 3/00 | (2006.01) |
| C11D 11/00 | (2006.01) |
| H01L 21/3213 | (2006.01) |
| G03F 7/42 | (2006.01) |
| C23G 1/20 | (2006.01) |
| C09K 13/00 | (2006.01) |
| H01L 21/311 | (2006.01) |

(52) U.S. Cl.
CPC .......... *C09K 13/02* (2013.01); *C09K 13/00* (2013.01); *C11D 3/0073* (2013.01); *C11D 3/044* (2013.01); *C11D 3/30* (2013.01); *C11D 3/3942* (2013.01); *C11D 3/3947* (2013.01); *C11D 3/3956* (2013.01); *C11D 7/06* (2013.01); *C11D 11/0047* (2013.01); *C23G 1/20* (2013.01); *G03F 7/423* (2013.01); *H01L 21/02052* (2013.01); *H01L 21/02057* (2013.01); *H01L 21/02063* (2013.01); *H01L 21/32134* (2013.01); *H01L 21/31144* (2013.01)

(58) Field of Classification Search
None
See application file for complete search history.

(56) References Cited

U.S. PATENT DOCUMENTS

| 5,209,858 | A | 5/1993 | Heinsohn et al. |
| 5,320,709 | A | 6/1994 | Bowden |
| 5,702,075 | A | 12/1997 | Lehrman |
| 5,849,220 | A * | 12/1998 | Batton ............. C23F 11/128 252/396 |
| 5,976,928 | A | 11/1999 | Kirlin et al. |
| 5,993,685 | A | 11/1999 | Currie et al. |
| 6,065,424 | A | 5/2000 | Shacham-Diamand et al. |
| 6,194,366 | B1 | 2/2001 | Naghshineh et al. |
| 6,211,126 | B1 | 4/2001 | Wojtczak et al. |
| 6,224,785 | B1 | 5/2001 | Wojtczak et al. |
| 6,280,651 | B1 | 8/2001 | Wojtczak et al. |
| 6,306,807 | B1 | 10/2001 | Wojtczak et al. |
| 6,322,600 | B1 | 11/2001 | Brewer et al. |
| 6,323,168 | B1 | 11/2001 | Kloffenstein et al. |
| 6,344,432 | B1 | 2/2002 | Wojtczak et al. |
| 6,346,741 | B1 | 2/2002 | Van Buskirk et al. |
| 6,395,194 | B1 | 5/2002 | Russell et al. |
| 6,409,781 | B1 | 6/2002 | Wojtczak et al. |
| 6,492,308 | B1 | 12/2002 | Naghshineh et al. |
| 6,527,819 | B2 | 3/2003 | Wojtczak et al. |
| 6,566,315 | B2 | 5/2003 | Wojtczak et al. |
| 6,627,587 | B2 | 9/2003 | Naghshineh et al. |
| 6,679,929 | B2 | 1/2004 | Hsu et al. |
| 6,698,619 | B2 | 3/2004 | Wertenberger |
| 6,723,691 | B2 | 4/2004 | Naghshineh et al. |
| 6,735,978 | B1 | 5/2004 | Tom et al. |
| 6,755,989 | B2 | 6/2004 | Wojtczak et al. |
| 6,773,873 | B2 | 8/2004 | Seijo et al. |
| 6,800,218 | B2 | 10/2004 | Ma et al. |
| 6,802,983 | B2 | 10/2004 | Mullee et al. |
| 6,849,200 | B2 | 2/2005 | Baum et al. |
| 6,875,733 | B1 | 4/2005 | Wojtczak |
| 6,896,826 | B2 | 5/2005 | Wojtczak et al. |

(Continued)

FOREIGN PATENT DOCUMENTS

| CN | 102217042 A | 10/2011 |
| CN | 103003923 A | 3/2013 |

(Continued)

OTHER PUBLICATIONS

International Search Report/Written Opinion, dated Oct. 20, 2014.

Primary Examiner — Jiong-Ping Lu
(74) Attorney, Agent, or Firm — Entegris, Inc.

(57) ABSTRACT

Compositions useful for the selective removal of titanium nitride and/or photoresist etch residue materials relative to metal conducting, e.g., cobalt, ruthenium and copper, and insulating materials from a microelectronic device having same thereon. The removal compositions contain at least one oxidant and one etchant, may contain various corrosion inhibitors to ensure selectivity.

16 Claims, No Drawings

(56) References Cited

U.S. PATENT DOCUMENTS

| | | |
|---|---|---|
| 6,943,139 B2 | 9/2005 | Korzenski et al. |
| 6,989,358 B2 | 1/2006 | Korzenski et al. |
| 7,011,716 B2 | 3/2006 | Xu et al. |
| 7,029,373 B2 | 4/2006 | Ma et al. |
| 7,030,168 B2 | 4/2006 | Xu et al. |
| 7,119,052 B2 | 10/2006 | Korzenski et al. |
| 7,119,418 B2 | 10/2006 | Xu et al. |
| 7,160,815 B2 | 1/2007 | Korzenski et al. |
| 7,188,644 B2 | 3/2007 | Kelly et al. |
| 7,223,352 B2 | 5/2007 | Korzenski et al. |
| 7,300,601 B2 | 11/2007 | Liu et al. |
| 7,326,673 B2 | 2/2008 | Xu et al. |
| 7,335,239 B2 | 2/2008 | Baum |
| 7,361,603 B2 | 4/2008 | Liu et al. |
| 7,365,045 B2 | 4/2008 | Walker et al. |
| 7,485,611 B2 | 2/2009 | Roeder et al. |
| 7,534,752 B2 | 5/2009 | Wojtczak et al. |
| 7,553,803 B2 | 6/2009 | Korzenski et al. |
| 7,557,073 B2 | 7/2009 | Korzenski et al. |
| 7,736,405 B2 | 6/2010 | Darsillo et al. |
| 7,888,301 B2 | 2/2011 | Bernhard et al. |
| 7,922,824 B2 | 4/2011 | Minsek et al. |
| 7,923,423 B2 | 4/2011 | Walker et al. |
| 7,960,328 B2 | 6/2011 | Visintin et al. |
| 8,026,200 B2 | 9/2011 | Cooper et al. |
| 8,058,219 B2 | 11/2011 | Rath et al. |
| 8,114,220 B2 | 2/2012 | Visintin et al. |
| 8,178,585 B2 | 5/2012 | Petruska et al. |
| 8,236,485 B2 | 8/2012 | Minsek et al. |
| 8,304,344 B2 | 11/2012 | Boggs et al. |
| 8,338,087 B2 | 12/2012 | Rath et al. |
| 8,367,555 B2 | 2/2013 | Afzali-Ardakani et al. |
| 8,618,036 B2 | 12/2013 | Afzali-Ardakani et al. |
| 8,685,909 B2 | 4/2014 | Angst et al. |
| 8,754,021 B2 | 6/2014 | Barnes et al. |
| 8,778,210 B2 | 7/2014 | Cooper et al. |
| 8,951,948 B2 | 2/2015 | Rath et al. |
| 9,045,717 B2 | 6/2015 | Nakanishi et al. |
| 9,063,431 B2 | 6/2015 | Barnes et al. |
| 9,074,169 B2 | 7/2015 | Chen et al. |
| 9,074,170 B2 | 7/2015 | Barnes et al. |
| 9,175,404 B2 | 11/2015 | Kojima et al. |
| 9,215,813 B2 | 12/2015 | Brosseau et al. |
| 9,221,114 B2 | 12/2015 | Chen et al. |
| 9,238,850 B2 | 1/2016 | Korzenski et al. |
| 9,546,321 B2 * | 1/2017 | Barnes ................... C09K 13/00 |
| 2002/0106975 A1 | 8/2002 | Chopra et al. |
| 2003/0114094 A1 | 6/2003 | Myoung et al. |
| 2005/0118832 A1 | 6/2005 | Korzenski et al. |
| 2005/0145311 A1 | 7/2005 | Walker et al. |
| 2005/0176603 A1* | 8/2005 | Hsu .......................... G03F 7/423 |
| | | 510/175 |
| 2005/0227482 A1 | 10/2005 | Korzenski et al. |
| 2005/0263490 A1 | 12/2005 | Liu et al. |
| 2005/0276979 A1 | 12/2005 | Slutz et al. |
| 2006/0019850 A1 | 1/2006 | Korzenski et al. |
| 2006/0063687 A1 | 3/2006 | Minsek et al. |
| 2006/0148666 A1 | 7/2006 | Peters et al. |
| 2006/0154186 A1 | 7/2006 | Minsek et al. |
| 2006/0226122 A1 | 10/2006 | Wojtczak et al. |
| 2006/0249482 A1* | 11/2006 | Wrschka .................. C09G 1/02 |
| | | 216/88 |
| 2007/0082497 A1 | 4/2007 | Lee et al. |
| 2007/0193708 A1 | 8/2007 | Broucek et al. |
| 2007/0225186 A1 | 9/2007 | Fisher |
| 2007/0251551 A1 | 11/2007 | Korzenski et al. |
| 2008/0076688 A1 | 3/2008 | Barnes et al. |
| 2008/0125342 A1 | 5/2008 | Visintin et al. |
| 2008/0171440 A1* | 7/2008 | Kodera ............... H01L 21/3212 |
| | | 438/692 |
| 2008/0271991 A1 | 11/2008 | Korzenski et al. |
| 2009/0032766 A1 | 2/2009 | Rajaratnam et al. |
| 2009/0082240 A1 | 3/2009 | Nukui |
| 2009/0192065 A1 | 7/2009 | Korzenski et al. |
| 2009/0212021 A1 | 8/2009 | Bernhard et al. |
| 2009/0215269 A1 | 8/2009 | Boggs et al. |
| 2009/0253072 A1 | 10/2009 | Petruska et al. |
| 2009/0301996 A1 | 12/2009 | Visintin et al. |
| 2010/0056410 A1 | 3/2010 | Visintin et al. |
| 2010/0065530 A1 | 3/2010 | Walker et al. |
| 2010/0087065 A1 | 4/2010 | Boggs et al. |
| 2010/0112728 A1* | 5/2010 | Korzenski ......... H01L 21/02079 |
| | | 438/3 |
| 2010/0163788 A1 | 7/2010 | Visintin et al. |
| 2010/0261632 A1 | 10/2010 | Korzenski et al. |
| 2010/0286014 A1 | 11/2010 | Barnes |
| 2011/0039747 A1 | 2/2011 | Zhou et al. |
| 2011/0117751 A1 | 5/2011 | Sonthalia et al. |
| 2012/0283163 A1* | 11/2012 | Barnes ...................... C11D 1/72 |
| | | 510/175 |
| 2012/0302483 A1* | 11/2012 | Minsek ................ C11D 7/3209 |
| | | 510/176 |
| 2013/0034923 A1 | 2/2013 | Kim et al. |
| 2013/0270217 A1 | 10/2013 | Yoshida et al. |
| 2013/0280123 A1 | 10/2013 | Chen et al. |
| 2013/0295712 A1 | 11/2013 | Chen et al. |
| 2013/0303420 A1 | 11/2013 | Cooper et al. |
| 2014/0038420 A1 | 2/2014 | Chen et al. |
| 2014/0306162 A1 | 10/2014 | Poe et al. |
| 2014/0318584 A1 | 10/2014 | Cooper et al. |
| 2014/0319423 A1 | 10/2014 | Cooper |
| 2015/0027978 A1* | 1/2015 | Barnes ...................... C23F 1/40 |
| | | 216/13 |
| 2015/0045277 A1 | 2/2015 | Liu et al. |
| 2015/0050199 A1 | 2/2015 | Korzenski et al. |
| 2015/0075570 A1 | 3/2015 | Wu et al. |
| 2015/0114429 A1 | 4/2015 | Jenq et al. |
| 2015/0162213 A1 | 6/2015 | Chen et al. |
| 2015/0168843 A1 | 6/2015 | Cooper et al. |
| 2015/0344825 A1 | 12/2015 | Cooper et al. |
| 2016/0020087 A1 | 1/2016 | Liu et al. |
| 2016/0032186 A1 | 2/2016 | Chen et al. |
| 2016/0075971 A1 | 3/2016 | Liu et al. |
| 2016/0122696 A1 | 5/2016 | Liu et al. |

FOREIGN PATENT DOCUMENTS

| | | |
|---|---|---|
| CN | 105683336 A | 6/2016 |
| JP | 2001-135601 A | 5/2001 |
| JP | 2001-257191 A | 9/2001 |
| JP | 2006-026769 A | 2/2006 |
| JP | 2009-531511 A | 9/2009 |
| JP | 2011159658 A | 8/2011 |
| JP | 2012021151 A | 2/2012 |
| JP | 2012062572 A | 3/2012 |
| JP | 2012186470 A | 9/2012 |
| JP | 2012251026 A | 12/2012 |
| JP | 2014-084489 A | 5/2014 |
| JP | 2016527707 A | 9/2016 |
| KR | 1020080072308 A | 8/2008 |
| TW | 201022148 A | 6/2010 |
| WO | 8810334 A1 | 12/1988 |
| WO | 2006005692 A1 | 1/2006 |
| WO | 2006110645 A2 | 10/2006 |
| WO | 2006127885 A1 | 11/2006 |
| WO | 2007027522 A2 | 3/2007 |
| WO | 2007111694 A2 | 10/2007 |
| WO | 2008036823 A2 | 3/2008 |
| WO | 2008141206 A2 | 11/2008 |
| WO | 2008157345 A2 | 12/2008 |
| WO | 2009073596 A2 | 6/2009 |
| WO | 2010017160 A2 | 2/2010 |
| WO | 2010039936 A2 | 4/2010 |
| WO | 2010086745 A1 | 8/2010 |
| WO | 2010091045 A2 | 8/2010 |
| WO | 2012048079 A2 | 4/2012 |
| WO | WO2012048079 * 4/2012 ................ C23F 1/02 |
| WO | 2012154498 A2 | 11/2012 |
| WO | 2012174518 A2 | 12/2012 |
| WO | 2013058770 A1 | 4/2013 |
| WO | 2013077855 A1 | 5/2013 |
| WO | 2013101907 A1 | 7/2013 |
| WO | WO2013101907 * 7/2013 ............ H01L 21/311 |

(56) References Cited

FOREIGN PATENT DOCUMENTS

| WO | 2013138278 A1 | 9/2013 |
|----|---------------|--------|
| WO | 2013154968 A1 | 10/2013 |
| WO | 2015130607 A1 | 9/2015 |

* cited by examiner

COMPOSITIONS AND METHODS FOR SELECTIVELY ETCHING TITANIUM NITRIDE

CROSS-REFERENCE TO RELATED APPLICATIONS

This application is filed under the provisions of 35 U.S.C. § 371 and claims the priority of International Patent Application No. PCT/US2014/041322 filed on 6 Jun. 2014 entitled "COMPOSITIONS AND METHODS FOR SELECTIVELY ETCHING TITANIUM NITRIDE" in the name of Li-Min CHEN, et al., which claims priority to U.S. Provisional Patent Application No. 61/831,928 filed on 6 Jun. 2013, both of which are hereby incorporated by reference herein in their entirety.

FIELD

The present invention relates to a composition and process for selectively etching titanium nitride and/or photoresist etch residues in the presence of metal conductor and insulator materials (i.e., low-k dielectrics), and more particularly to a composition and process for effectively and efficiently etching titanium nitride and/or photoresist etch residues at an etch rate and selectivity that is higher than that of exposed or underlying layers of copper, cobalt, ruthenium, and low-k dielectric materials.

DESCRIPTION OF THE RELATED ART

Photoresist masks are commonly used in the semiconductor industry to pattern materials such as semiconductors or dielectrics. In one application, photoresist masks are used in a dual damascene process to form interconnects in the back-end metallization of a microelectronic device. The dual damascene process involves forming a photoresist mask on a low-k dielectric layer overlying a metal conductor layer, such as a copper or a cobalt layer. The low-k dielectric layer is then etched according to the photoresist mask to form a via and/or trench that expose the metal conductor layer. The via and trench, commonly known as dual damascene structure, are usually defined using two lithography steps. The photoresist mask is then removed from the low-k dielectric layer before a conductive material is deposited into the via and/or trench to form an interconnect.

With the decreasing size of microelectronic devices, it becomes more difficult to achieve the critical dimensions for vias and trenches. Thus, metal hard masks are used to provide better profile control of vias and trenches. The metal hard masks can be made of titanium or titanium nitride, and are removed by a wet etching process after forming the via and/or trench of the dual damascene structure. It is essential that the wet etching process uses a removal chemistry that effectively removes the metal hard mask and/or photoresist etch residues without affecting the underlying metal conductor layer and low-k dielectric material. In other words, the removal chemistry is required to be highly selective to the metal conductor layer and low-k dielectric layer.

Accordingly, an object of the present invention to provide improved compositions for the selective removal of hard mask materials relative to metal conductor layers and low-k dielectric layers that are present, while not compromising the etch rate of the hard mask.

SUMMARY OF THE INVENTION

The present invention relates to a composition and process for selectively etching hard mask layers and/or photoresist etch residues relative to metal conductor layers and low-k dielectric layers that are present. More specifically, the present invention relates to a composition and process for selectively etching titanium nitride and/or photoresist etch residues relative to copper, cobalt, ruthenium, and low-k dielectric layers.

In one aspect, a composition for selectively removing titanium nitride and/or photoresist etch residue material from the surface of a microelectronic device having same thereon is described, said composition comprising at least one oxidizing agent, at least one etchant, at least one metal corrosion inhibitor, at least one chelating agent, and at least one solvent.

In another aspect, a method of etching titanium nitride material and/or photoresist etch residue from a surface of a microelectronic device having same thereon is described, said method comprising contacting the surface with a composition, wherein the composition selectively removes the titanium nitride material and/or photoresist etch residue from the surface relative to metals and insulating materials, and wherein said composition comprises at least one oxidizing agent, at least one etchant, at least one metal corrosion inhibitor, at least one chelating agent, and at least one solvent.

Other aspects, features and embodiments of the invention will be more fully apparent from the ensuing disclosure and appended claims.

DETAILED DESCRIPTION, AND PREFERRED EMBODIMENTS THEREOF

In general, the present invention relates to compositions and processes for selectively etching hard mask layers and/or photoresist etch residues relative to metal conductor layers and low-k dielectric layers that are present. More specifically, the present invention relates to a composition and process for selectively etching titanium nitride and/or photoresist etch residues relative to copper, cobalt, ruthenium, and low-k dielectric layers. Other materials that may be present on the microelectronic device, should not be substantially removed or corroded by said compositions.

For ease of reference, "microelectronic device" corresponds to semiconductor substrates, flat panel displays, phase change memory devices, solar panels and other products including solar cell devices, photovoltaics, and microelectromechanical systems (MEMS), manufactured for use in microelectronic, integrated circuit, energy collection, or computer chip applications. It is to be understood that the terms "microelectronic device," "microelectronic substrate" and "microelectronic device structure" are not meant to be limiting in any way and include any substrate or structure that will eventually become a microelectronic device or microelectronic assembly. The microelectronic device can be patterned, blanketed, a control and/or a test device.

"Hardmask capping layer" as used herein corresponds to materials deposited over dielectric material to protect same during the plasma etch step. Hardmask capping layers are traditionally silicon nitrides, silicon oxynitrides, titanium nitride, titanium oxynitride, titanium and other similar compounds.

As used herein, "titanium nitride" and "TiN$_x$" correspond to pure titanium nitride as well as impure titanium nitride including varying stoichiometries, and oxygen content (Ti-O$_x$N$_y$)

As used herein, "about" is intended to correspond to ±5% of the stated value.

As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

As defined herein, "metal conductor layers" comprise copper, tungsten, cobalt, molybdenum, aluminum, ruthenium, alloys comprising same, and combinations thereof.

As defined herein, "amine" species include at least one primary, secondary, and tertiary amines, with the proviso that (i) species including both a carboxylic acid group and an amine group, (ii) surfactants that include amine groups, and (iii) species where the amine group is a substituent (e.g., attached to an aryl or heterocyclic moiety) are not considered "amines" according to this definition. The amine formula can be represented by $NR^1R^2R^3$, wherein $R^1$, $R^2$ and $R^3$ can be the same as or different from one another and are selected from the group consisting of hydrogen, straight-chained or branched $C_1$-$C_6$ alkyls (e.g., methyl, ethyl, propyl, butyl, pentyl, hexyl), $C_6$-$C_{10}$ aryls (e.g., benzyl), straight-chained or branched $C_1$-$C_6$ alkanols (e.g., methanol, ethanol, propanol, butanol, pentanol, hexanol), and combinations thereof, with the proviso that $R^1$, $R^2$ and $R^3$ cannot all be hydrogen.

As defined herein, "photoresist etch residues" corresponds to any residue comprising photoresist material, or material that is a by-product of photoresist subsequent to an etching or ashing step, as readily understood by the person skilled in the art. The photoresist etch residue may include silicon-containing material, titanium-containing material, nitrogen-containing material, oxygen-containing material, polymeric residue material, copper-containing residue material (including copper oxide residue), tungsten-containing residue material, cobalt-containing residue material, etch gas residue such as chlorine and fluorine, and combinations thereof.

"Substantially devoid" is defined herein as less than 2 wt. %, preferably less than 1 wt. %, more preferably less than 0.5 wt. %, even more preferably less than 0.1 wt. %, and most preferably 0 wt. %.

As used herein, "fluoride" species correspond to species including an ionic fluoride ($F^-$) or covalently bonded fluorine. It is to be appreciated that the fluoride species may be included as a fluoride species or generated in situ.

As used herein, "chloride" species correspond to species including an ionic chloride ($Cl^-$), with the proviso that surfactants that include chloride anions are not considered "chlorides" according to this definition.

As defined herein, a strong base is any base having at least one pKa greater than 11, while a weak base is any base having at least one pKa less than 11.

Compositions of the invention may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed.

Embodiments of the present invention include a chemistry for removing hard mask and/or photoresist etch residues. In one embodiment, the removal composition is a wet-etch solution that removes a metal hard mask and/or photoresist etch residues on a dielectric layer and is highly selective to a metal conductor layer underneath the dielectric layer and the dielectric layer itself. In a more specific embodiment, the removal composition is a wet-etch solution that removes a titanium nitride layer and/or photoresist etch residues that is highly selective to at least one of copper, cobalt, ruthenium, and low-k dielectric materials.

In a first aspect, a composition for selectively removing titanium nitride and/or photoresist etch residue material from the surface of a microelectronic device having same thereon is described, said composition including at least one oxidizing agent and at least one etchant. In one embodiment, the composition for removing titanium nitride and/or photoresist etch residue material from the surface of a microelectronic device having same thereon comprises, consists of, or consists essentially of at least one oxidizing agent, at least one etchant, at least one metal corrosion inhibitor, and at least one solvent. In another embodiment, the composition for removing titanium nitride and/or photoresist etch residue material from the surface of a microelectronic device having same thereon comprises, consists of, or consists essentially of at least one oxidizing agent, at least one etchant, at least one chelating agent, and at least one solvent. In another embodiment, the composition for removing titanium nitride and/or photoresist etch residue material from the surface of a microelectronic device having same thereon comprises, consists of, or consists essentially of at least one oxidizing agent, at least one etchant, at least one chelating agent, at least one metal corrosion inhibitor, and at least one solvent. In yet another embodiment, the composition for removing titanium nitride and/or photoresist etch residue material from the surface of a microelectronic device having same thereon comprises, consists of, or consists essentially of at least one oxidizing agent, at least one etchant, at least one chelating agent, at least one metal corrosion inhibitor, at least one surfactant, and at least one solvent. In another embodiment, the composition for removing titanium nitride and/or photoresist etch residue material from the surface of a microelectronic device having same thereon comprises, consists of, or consists essentially of at least one oxidizing agent, at least one etchant, at least one metal corrosion inhibitor, at least one surfactant, and at least one solvent. In yet another embodiment, the composition for removing titanium nitride and/or photoresist etch residue material from the surface of a microelectronic device having same thereon comprises, consists of, or consists essentially of at least one oxidizing agent, at least one etchant, at least one chelating agent, at least one surfactant, and at least one solvent. In still another embodiment, the composition for removing titanium nitride and/or photoresist etch residue material from the surface of a microelectronic device having same thereon comprises, consists of, or consists essentially of at least one oxidizing agent, at least one etchant, at least one chelating agent, and at least two solvents, wherein at least one solvent is a water-miscible organic solvent. In each embodiment of the first aspect, at least one silicon-containing compound and/or at least one low-k passivating agent can be added. These compositions are substantially devoid of silicates, abrasive materials, metal halides, and combinations thereof. These compositions have pH value in a range from about 5 to about 12, preferably about 6 to about 10.

Etchants are added to increase the etch rate of the titanium nitride. Etchants contemplated include, but are not limited to, HF, ammonium fluoride, tetrafluoroboric acid, hexafluorosilicic acid, other compounds containing B—F or Si—F bonds, tetrabutylammonium tetrafluoroborate (TBA-BF$_4$), tetraalkylammonium fluoride (NR$_1$R$_2$R$_3$R$_4$F), strong bases such as tetraalkylammonium hydroxide (NR$_1$R$_2$R$_3$R$_4$OH), where R$_1$, R$_2$, R$_3$, R$_4$ may be the same as or different from one another and is selected from the group consisting of hydrogen, straight-chained or branched C$_1$-C$_6$ alkyl groups (e.g., methyl, ethyl, propyl, butyl, pentyl, hexyl), C$_1$-C$_6$ alkoxy groups (e.g., hydroxyethyl, hydroxypropyl) substituted or unsubstitued aryl groups (e.g., benzyl), weak bases, and combinations thereof. Preferably, the fluoride source comprises tetrafluoroboric acid, hexafluorosilicic acid, H$_2$ZrF$_6$, H$_2$TiF$_6$, HPF$_6$, ammonium fluoride, tetramethylammonium fluoride, tetramethylammonium hydroxide, ammonium hexafluorosilicate, ammonium hexafluorotitanate, or a combination of ammonium fluoride and tetramethylammonium fluoride. Alternatively, or in addition to fluoride sources, the etchant can comprise a strong base such as tetramethylammonium hydroxide (TMAH), tetraethylammonium hydroxide (TEAH), tetrapropylammonium hydroxide (TPAH), tetrabutylammonium hydroxide (TBAH), benzyltrimethylammonium hydroxide (BTMAH), potassium hydroxide, ammonium hydroxide, benzyltriethylammonium hydroxide (BTEAH), tetrabutylphosphonium hydroxide (TBPH), (2-hydroxyethyl) trimethylammonium hydroxide (choline hydroxide), (2-hydroxyethyl) triethylammonium hydroxide, (2-hydroxyethyl) tripropylammonium hydroxide, (1-hydroxypropyl) trimethylammonium hydroxide, ethyltrimethylammonium hydroxide, diethyldimethylammonium hydroxide (DEDMAH), tris(2-hydroxyethyl) methyl ammonium hydroxide (THEMAH), 1,1,3,3-tetramethylguanidine (TMG), potassium hydroxide, guanidine carbonate, arginine, and combinations thereof. If choline hydroxide is used, it is known by the person skilled in the art that the commercial product often includes a small amount of stabilizer to minimize the degradation of the choline hydroxide to undesired byproducts. Choline hydroxide stabilizers are known in the art and include, but are not limited to, formaldehyde, hydroxylamine, sulfites, and hydrides. Weak bases contemplated include, but are not limited to, ammonium hydroxide, monoethanolamine (MEA), diethanolamine (DEA), triethanolamine (TEA), ethylenediamine, cysteine, and combinations thereof. Most preferably, the etchant comprises a tetraalkylammonium hydroxide, choline hydroxide, potassium hydroxide, and/or THEMAH, more preferably TMAH, choline hydroxide, potassium hydroxide, THEMAH, and any combination thereof.

Oxidizing agents are included to oxidize Ti$^{3+}$ in TiN$_x$. Oxidizing agents contemplated herein include, but are not limited to, hydrogen peroxide (H$_2$O$_2$), FeCl$_3$, FeF$_3$, Fe(NO$_3$)$_3$, Sr(NO$_3$)$_2$, CoF$_3$, MnF$_3$, oxone (2KHSO$_5$.KHSO$_4$.K$_2$SO$_4$), periodic acid, iodic acid, vanadium (V) oxide, vanadium (IV, V) oxide, ammonium vanadate, ammonium polyatomic salts (e.g., ammonium peroxomonosulfate, ammonium chlorite (NH$_4$ClO$_2$), ammonium chlorate (NH$_4$ClO$_3$), ammonium iodate (NH$_4$IO$_3$), ammonium nitrate (NH$_4$NO$_3$), ammonium perborate (NH$_4$BO$_3$), ammonium perchlorate (NH$_4$ClO$_4$), ammonium periodate (NH$_4$IO$_4$), ammonium persulfate ((NH$_4$)$_2$S$_2$O$_8$), ammonium hypochlorite (NH$_4$ClO)), ammonium hypobromite, ammonium tungstate ((NH$_4$)$_{10}$H$_2$(W$_2$O$_7$)), sodium polyatomic salts (e.g., sodium persulfate (Na$_2$S$_2$O$_8$), sodium hypochlorite (NaClO), sodium perborate, sodium hypobromite (NaBrO)), potassium polyatomic salts (e.g., potassium iodate (KIO$_3$), potassium permanganate (KMnO$_4$), potassium persulfate, nitric acid (HNO$_3$), potassium persulfate (K$_2$S$_2$O$_8$), potassium hypochlorite (KClO)), tetramethylammonium polyatomic salts (e.g., tetramethylammonium chlorite ((N(CH$_3$)$_4$)ClO$_2$), tetramethylammonium chlorate ((N(CH$_3$)$_4$)ClO$_3$), tetramethylammonium iodate ((N(CH$_3$)$_4$)IO$_3$), tetramethylammonium perborate ((N(CH$_3$)$_4$)BO$_3$), tetramethylammonium perchlorate ((N(CH$_3$)$_4$)ClO$_4$), tetramethylammonium periodate ((N(CH$_3$)$_4$)IO$_4$), tetramethylammonium persulfate ((N(CH$_3$)$_4$)S$_2$O$_8$)), tetrabutylammonium polyatomic salts (e.g., tetrabutylammonium peroxomonosulfate), peroxomonosulfuric acid, ferric nitrate (Fe(NO$_3$)$_3$), urea hydrogen peroxide ((CO(NH$_2$)$_2$)H$_2$O$_2$), peracetic acid (CH$_3$(CO)OOH), 1,4-benzoquinone, toluquinone, dimethyl-1,4-benzoquinone, chloranil, alloxan, N-methylmorpholine N-oxide, trimethylamine N-oxide, and combinations thereof. When the oxidizing agent is a salt it can be hydrated or anhydrous. The oxidizing agent may be introduced to the composition at the manufacturer, prior to introduction of the composition to the device wafer, or alternatively at the device wafer, i.e., in situ. Preferably, the oxidizing agent for the composition of the second aspect comprises hydrogen peroxide. Preferably, the oxidizing agent for the composition of the first aspect comprises hydrogen peroxide, ammonium hypochlorite, sodium hypochlorite, and any combination thereof.

When the oxidizing agent comprises iodate or periodate, an iodine scavenger is preferably added to the removal composition. Although not wishing to be bound by theory, it is thought that as the iodate or periodate are reduced, iodine accumulates, which increases the rate of copper etch. Iodine scavengers include, but are not limited to, ketones more preferably ketones with hydrogen(s) alpha to the carbonyl such as 4-methyl-2-pentanone, 2,4-dimethyl-3-pentanone, cyclohexanone, 5-methyl-3-heptanone, 3-pentanone, 5-hydroxy-2-pentanone, 2,5-hexanedione, 4-hydroxy-4-methyl-2-pentanone, acetone, butanone, 2-methyl-2-butanone, 3,3-dimethyl-2-butanone, 4-hydroxy-2-butanone, cyclopentanone, 2-pentanone, 3-pentanone, 1-phenylethanone, acetophenone, benzophenone, 2-hexanone, 3-hexanone, 2-heptanone, 3-heptanone, 4-heptanone, 2,6-dimethyl-4-heptanone, 2-octanone, 3-octanone, 4-octanone, dicyclohexyl ketone, 2,6-dimethylcyclohexanone, 2-acetylcyclohexanone, 2,4-pentanedione, menthone, and combinations thereof. Preferably, the iodine scavenger includes 4-methyl-2-pentanone, 2,4-dimethyl-3-pentanone, or cyclohexanone.

Chelating agents are added to increase the etch rate of the TiN$_x$ and the photoresist etch residue cleaning performance and are largely oxidation resistant. Chelating agents contemplated include, but are not limited to, β-diketonate compounds such as acetylacetonate, 1,1,1-trifluoro-2,4-pentanedione, and 1,1,1,5,5,5-hexafluoro-2,4-pentanedione; amines and amino acids such as glycine, serine, proline, leucine, alanine, asparagine, aspartic acid, glutamine, valine, and lysine; polyprotic acids selected from the group consisting of iminodiacetic acid (IDA), malonic acid, oxalic acid, succinic acid, boric acid, nitrilotriacetic acid, malic acid, citric acid, acetic acid, maleic acid, ethylenediaminetetraacetic acid (EDTA), EDTA-2NH$_3$ (ethylenediaminetetraacetic acid diammonium salt), (1,2-cyclohexylenedinitrilo)tetraacetic acid (CDTA), diethylenetriamine pentaacetic acid (DTPA), 2-phosphonobutane-1,2,4-tricarboxylic acid (PBTCA), ethylendiamine disuccinic acid, and propylenediamine tetraacetic acid; phosphonic acid; phosphonic acid derivatives such as hydroxyethylidene diphosphonic acid (HEDP) (Dequest 2010), 1-hydroxyethane-1,1-diphosphonic acid, nitrilo-tris(methylenephosphonic acid) (NTMP), amino tri(methylene phosphonic acid) (Dequest 2000), diethylenetriamine penta(methylene phosphonic acid) (Dequest 2060S), ethylenediamine tetra(methylene phosphonic acid) (EDTMPA); ethylenediamine; 2,4-pentanedione; benzalkonium chloride; 1-imidazole; tetraglyme; pentamethyldiethylenetriamine (PMDETA); 1,3,5-triazine-2,4,6-thithiol trisodium salt solution; 1,3,5-triazine-2,4,6-thithiol triammonium salt solution; sodium diethyldithiocarbamate; disubstituted dithiocarbamates ($R^1(CH_2CH_2O)_2NR^2CS_2Na$) with one alkyl group ($R^2$=hexyl, octyl, decenyl or dodecyl) and one oligoether ($R^1(CH_2CH_2O)_2$, where $R^1$=ethyl or butyl); sulfanilamide; monoethanolamine (MEA); 2-hydroxypyridine 1-oxide; sodium triphosphate penta basic; and combinations thereof. Alternatively, or in addition to, the chelating agents include salts which comprise an ammonium cation or a tetraalkylammonium cation ($[NR^1R^2R^3R^4]^+$, where $R^1$, $R^2$, $R^3$ and $R^4$ may be the same as or different from one another and are selected from the group consisting of hydrogen and $C_1$-$C_6$ alkyl (e.g., methyl, ethyl, propyl, butyl, pentyl, hexyl)), and an anion selected from the group consisting of acetate, chloride, bromide, iodide, sulfate, benzoate, propionate, citrate, formate, oxalate, tartarate, succinate, lactate, maleate, malonate, fumarate, malate, ascorbate, mandelate, and phthalate. For example, the salts can include ammonium bromide and/or ammonium chloride. Most preferably, the chelating agent comprises at least one of ammonium bromide, ammonium chloride, phosphonic acid, CDTA, phosphonic acid derivatives (e.g., HEDP, DTPA, NTMP, EDTMPA), and any combination thereof.

Metal corrosion inhibitors are added to block the oxidative activity of the oxidizing agent(s) and the carboxylate salt(s) (when present). Metal corrosion inhibitors contemplated herein include, but are not limited to, 5-amino-1,3,4-thiadiazole-2-thiol (ATDT), 2-amino-5-ethyl-1,3,4-thiadiazole, benzotriazole (BTA), 1,2,4-triazole (TAZ), tolyltriazole, 5-methyl-benzotriazole (mBTA), 5-phenyl-benzotriazole, 5-nitro-benzotriazole, benzotriazole carboxylic acid, 3-amino-5-mercapto-1,2,4-triazole, 1-amino-1,2,4-triazole, hydroxybenzotriazole, 2-(5-amino-pentyl)-benzotriazole, 1-amino-1,2,3-triazole, 1-amino-5-methyl-1,2,3-triazole, 3-amino-1,2,4-triazole (3-ATA), 3-mercapto-1,2,4-triazole, 3-isopropyl-1,2,4-triazole, 5-phenylthiol-benzotriazole, halo-benzotriazoles (halo=F, Cl, Br or I), naphthotriazole, 2-mercaptobenzimidazole (MBI), 2-mercaptobenzothiazole, 4-methyl-2-phenylimidazole, 2-mercaptothiazoline, 5-amino-1,2,4-triazole (5-ATA), sodium dedecyl sulfate (SDS), ATA-SDS, 3-amino-5-mercapto-1,2,4-triazole, 3,5-diamino-1,2,4-triazole, pentylenetetrazole, 5-phenyl-1H-tetrazole, 5-benzyl-1H-tetrazole, 5-methyltetrazole, 5-mercapto-1-methyl-tetrazole, 1-phenyl-1H-tetrazole-5-thiol, Ablumine O (Taiwan Surfactant), 2-benzylpyridine, succinimide, 2,4-diamino-6-methyl-1,3,5-triazine, thiazole, triazine, methyltetrazole, 1,3-dimethyl-2-imidazolidinone, 1,5-pentamethylenetetrazole, 1-phenyl-5-mercaptotetrazole, diaminomethyltriazine, imidazoline thione, 4-methyl-4H-1,2,4-triazole-3-thiol, 4-amino-4H-1,2,4-triazole, 3-amino-5-methylthio-1H-1,2,4-triazole, benzothiazole, imidazole, benzimidazole, 2-aminobenzimidazole, 1-methylimidazole, indiazole, adenine, succinimide, adenosine, carbazole, saccharin, uric acid, and benzoin oxime. Additional corrosion inhibitors include cationic quaternary salts such as benzalkonium chloride, benzyldimethyldodecylammonium chloride, myristyltrimethylammonium bromide, dodecyltrimethylammonium bromide, hexadecylpyridinium chloride, Aliquat 336 (Cognis), benzyldimethylphenylammonium chloride, Crodaquat TES (Croda Inc.), Rewoquat CPEM (Witco), hexadecyltrimethylammonium p-toluenesulfonate, hexadecyltrimethylammonium hydroxide, 1-methyl-1'-tetradecyl-4,4'-bipyridium dichloride, alkyltrimethylammonium bromide, amprolium hydrochloride, benzethonium hydroxide, benzethonium chloride, benzyldimethylhexadecylammonium chloride, benzyldimethyltetradecylammonium chloride, benzyldodecyldimethylammonium bromide, benzyldodecyldimethylammonium chloride, cetylpyridinium chloride, choline p-toluenesulfonate salt, dimethyldioctadecylammonium bromide, dodecylethyldimethylammonium bromide, dodecyltrimethylammonium chloride, decyltrimethylammonium Chloride (DTAC), ethylhexadecyldimethylammonium bromide, Girard's reagent, hexadecyl(2-hydroxyethyl)dimethylammonium dihydrogen phosphate, dexadecylpyridinium bromide, hexadecyltrimethylammonium bromide, hexadecyltrimethylammonium chloride, methylbenzethonium chloride, Hyamine® 1622, Luviquat™, N,N',N'-polyoxyethylene (10)-N-tallow-1,3-diaminopropane liquid, oxyphenonium bromide, tetraheptylammonium bromide, tetrakis(decyl)ammonium bromide, thonzonium bromide, tridodecylammonium chloride, trimethyloctadecylammonium bromide, 1-methyl-3-n-octylimidazolium tetrafluoroborate, 1-decyl-3-methylimidazolium tetrafluoroborate. 1-decyl-3-methylimidazolium chloride, tridodecylmethylammonium bromide, dimethyldistearylammonium chloride, cetyltrimethylammonium bromide, myristyltrimethylammonium bromide, and hexamethonium chloride. Other corrosion inhibitors include non-ionic surfactants such as PolyFox PF-159 (OMNOVA Solutions), poly(ethylene glycol) ("PEG"), poly(propylene glycol) ("PPG"), ethylene oxide/propylene oxide block copolymers such as Pluronic F-127 (BASF), polyoxyethylene (20) sorbitan monooleate (Tween 80), polyoxyethylene (20) sorbitan monopalmitate (Tween 40), polyoxyethylene (20) sorbitan monolaurate (Tween 20), polyoxypropylene/polyoxyethylene block copolymers such as Pluronic L31, Pluronic 31R1, Pluronic 25R2 and Pluronic 25R4, anionic surfactants such as dodecylbenzenesulfonic acid, sodium dodecylbenzenesulfonate, dodecylphosphonic acid (DDPA), bis(2-ethylhexyl)phosphate, benzylphosphonic acid, diphenylphosphinic acid, 1,2-ethylenediphosphonic acid, phenylphosphonic acid, cinnamic acid and combinations thereof. The quaternary salts can function as both corrosion inhibitors (especially for copper, cobalt, and ruthenium) and wetting agents. It will be obvious to those skilled in the art that, while quaternary salts are available commercially most often as chlorides or bromides, it is easy to ion-exchange the halide anion with non-halide anions such as sulfate, methanesulfonate, nitrate, hydroxide, etc. Such converted quaternary salts are also contemplated herein. In a particularly preferred embodiment, 5-methyl-1H-benzotriazole, 3-amino-1,2,4-triazole, TAZ, DTAC, and Tween 80 are known to block the oxidative activity of the oxidizing agents against copper. Other preferred corrosion inhibitors include the cationic quaternary salts, more preferably MBI, adenosine, benzothiazole, DDPA, Tween 80, and any combination thereof.

The at least one solvent can comprise water, at least one water-miscible organic solvent, or a combination thereof. For example, the at least one solvent can comprise at least one species selected from the group consisting of water, methanol, ethanol, isopropanol, butanol, pentanol, hexanol, 2-ethyl-1-hexanol, heptanol, octanol, ethylene glycol, propylene glycol, butylene glycol, hexylene glycol, butylene carbonate, ethylene carbonate, propylene carbonate, choline bicarbonate, dipropylene glycol, dimethylsulfoxide, sulfolane, tetrahydrofurfuryl alcohol (THFA), 1,2-butanediol, 1,4-butanediol, tetramethyl urea, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether, triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether (TPGME), dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, 2,3-dihydrodecafluoropentane, ethyl perfluorobutylether, methyl perfluorobutylether, alkyl carbonates, 4-methyl-2-pentanol, and combinations thereof. Preferably, the at least one solvent comprises water, most preferably deionized water.

Compositions of the first aspect can further include at least one low-k passivating agent to reduce the chemical attack of the low-k dielectric layers and to protect the wafer from additional oxidation. Preferred low-k passivating agent include, but are not limited to, boric acid, borate salts, such as ammonium pentaborate, sodium tetraborate, 3-hydroxy-2-naphthoic acid, malonic acid, and iminodiacetic acid. When present, the composition includes about 0.01 wt % to about 2 wt % low-k passivating agent, based on the total weight of the composition. Preferably, less than 2 wt. % of the underlying low-k material is etched/removed using the compositions described herein, more preferably less than 1 wt. %, most preferably less than 0.5 wt. %, based on the total weight of the underlying low-k material.

Compositions of the first aspect can further include at least one silicon-containing compound to reduce the activity of the etchant source. In one embodiment, the at least one silicon-containing compounds comprises an alkoxysilane. Alkoxysilanes contemplated have the general formula $SiR^1R^2R^3R^4$, wherein the $R^1$, $R^2$, $R^3$ and $R^4$ are the same as or different from one another and are selected from the group consisting of straight-chained $C_1$-$C_6$ alkyl groups (e.g., methyl, ethyl, propyl, butyl, pentyl, hexyl), branched $C_1$-$C_6$ alkyl groups, $C_1$-$C_6$ alkoxy groups (e.g. methoxy, ethoxy, propoxy, butoxy, pentoxy, hexoxy), a phenyl group, and a combination thereof. It should be appreciated by the skilled artisan, that to be characterized as an alkoxysilane, at least one of $R^1$, $R^2$, $R^3$ or $R^4$ must be a $C_1$-$C_6$ alkoxy group. Alkoxysilanes contemplated include methyltrimethoxysilane, dimethyldimethoxysilane, phenyltrimethoxysilane, tetraethoxysilane (TEOS), N-propyltrimethoxysilane, N-propyltriethoxysilane, hexyltrimethoxysilane, hexyltriethoxysilane, and combinations thereof. Other silicon-containing compounds that can be used instead or in addition to the alkoxysilanes include ammonium hexafluorosilicate, sodium silicate, potassium silicate, tetramethyl ammonium silicate (TMAS), and combinations thereof. Preferably, the silicon-containing compound comprises TEOS, TMAS, and sodium silicate, potassium silicate. When present, the amount of silicon-containing compound(s) is in the range from about 0.001 wt % to about 2 wt %, based on the total weight of the composition.

To ensure wetting, especially when the pH is low, a surfactant can be added to the aqueous composition, preferably an oxidation resistant, fluorinated anionic surfactant. Anionic surfactants contemplated in the compositions of the present invention include, but are not limited to, fluorosurfactants such as ZONYL® UR and ZONYL® FS-62 (DuPont Canada Inc., Mississauga, Ontario, Canada), and ammonium fluoroalkylsulfonates such as Novec™ 4300 (3M). When the etchant used comprises a fluoride, it is contemplated to use a long-chain tetraalkylammonium fluoride that can be used as a surfactant and the etchant.

In another embodiment, any of the compositions of the invention may further comprise titanium nitride and/or photoresist etch material residue, wherein the residue is suspended and/or dissolved in the aqueous composition.

In an embodiment of the composition of the first aspect, the composition comprises, consists of, or consists essentially of at least one oxidizing agent, at least one etchant, at least one metal corrosion inhibitor, and at least one solvent, present in the following ranges, based on the total weight of the composition:

| component | % by weight | more preferred % by weight | most preferred % by weight |
| --- | --- | --- | --- |
| oxidizing agent(s) | about 10 wt % to about 40 wt % | about 10 wt % to about 30 wt % | about 15 wt % to about 30 wt % |
| etchant(s) | about 0.01 wt % to about 15 wt % | about 0.2 wt % to about 10 wt % | about 0.1 wt % to about 10 wt % |
| metal corrosion inhibitor(s) | about 0.01 to about 2 wt % | about 0.02 to about 1.5 wt % | about 0.02 to about 1 wt % |
| solvent(s) | about 3 wt % to about 99.98 wt % | about 58.5 wt % to about 98.8 wt % | about 59 wt % to about 94.9 wt % |

Preferably, the oxidizing agent comprises hydrogen peroxide and the etchant comprises TMAH, KOH, choline hydroxide, THEMAH, or a combination of KOH/choline hydroxide.

In still another embodiment of the composition of the first aspect, the composition comprises, consists of, or consists essentially of at least one oxidizing agent, at least one etchant, at least one chelating agent, and at least one solvent, present in the following ranges, based on the total weight of the composition:

| component | % by weight | more preferred % by weight | most preferred % by weight |
| --- | --- | --- | --- |
| oxidizing agent(s) | about 10 wt % to about 40 wt % | about 10 wt % to about 30 wt % | about 15 wt % to about 30 wt % |
| etchant(s) | about 0.01 wt % to about 15 wt % | about 0.2 wt % to about 10 wt % | about 0.1 wt % to about 10 wt % |
| chelating agent(s) | about 0.01 to about 1 wt % | about 0.01 to about 1 wt % | about 0.01 to about 0.5 wt % |
| solvent(s) | about 34 wt % to about 99.99 wt % | about 59 wt % to about 98.8 wt % | about 59.5 wt % to about 94.9 wt % |

Preferably, the oxidizing agent comprises hydrogen peroxide and the etchant comprises TMAH, KOH, choline hydroxide, THEMAH, or a combination of KOH/choline hydroxide.

In yet another embodiment of the composition of the first aspect, the composition comprises, consists of, or consists essentially of at least one oxidizing agent, at least one etchant, at least one chelating agent, at least one metal corrosion inhibitor, and at least one solvent, present in the following ranges, based on the total weight of the composition:

| component | % by weight | more preferred % by weight | most preferred % by weight |
|---|---|---|---|
| oxidizing agent(s) | about 10 wt % to about 40 wt % | about 10 wt % to about 30 wt % | about 15 wt % to about 30 wt % |
| etchant(s) | about 0.01 wt % to about 15 wt % | about 0.2 wt % to about 10 wt % | about 0.1 wt % to about 10 wt % |
| metal corrosion inhibitor(s) | about 0.01 to about 2 wt % | about 0.02 to about 1.5 wt % | about 0.02 to about 1 wt % |
| chelating agent(s) | about 0.01 to about 1 wt % | about 0.01 to about 1 wt % | about 0.01 to about 0.5 wt % |
| solvent(s) | about 32 wt % to about 99.99 wt % | about 57.5 wt % to about 98.8 wt % | about 58.5 wt % to about 94.9 wt % |

Preferably, the oxidizing agent comprises hydrogen peroxide and the etchant comprises TMAH, KOH, choline hydroxide, THEMAH, or a combination of KOH/choline hydroxide.

Preferably, the composition of the first aspect comprises, consists of, or consists essentially of water, TMAH, CDTA, and at least one corrosion inhibitor. In another preferred embodiment, the composition of the first aspect comprises, consists of, or consists essentially of water, TMAH, CDTA, at least one corrosion inhibitor, and hydrogen peroxide. In still another preferred embodiment, the composition of the first aspect comprises, consists of, or consists essentially of water, TMAH, CDTA, and DDPA. In another preferred embodiment, the composition of the first aspect comprises, consists of, or consists essentially of water, TMAH, CDTA, DDPA, and hydrogen peroxide. In yet another preferred embodiment, the composition of the first aspect comprises, consists of, or consists essentially of water, TMAH, CDTA, and 3-amino-1,2,4-triazole. In another preferred embodiment, the composition of the first aspect comprises, consists of, or consists essentially of water, TMAH, CDTA, 3-amino-1,2,4-triazole, and hydrogen peroxide. In still another preferred embodiment, the composition of the first aspect comprises, consists of, or consists essentially of water, TMAH, CDTA, and 1,2,4-triazole. In another preferred embodiment, the composition of the first aspect comprises, consists of, or consists essentially of water, TMAH, CDTA, 1,2,4-triazole, and hydrogen peroxide. In another preferred embodiment, the composition of the first aspect comprises, consists of, or consists essentially of water, TMAH, CDTA, DDPA, and 3-amino-1,2,4-triazole. In another preferred embodiment, the composition of the first aspect comprises, consists of, or consists essentially of water, TMAH, CDTA, DDPA, 3-amino-1,2,4-triazole, and hydrogen peroxide. In yet another preferred embodiment, the composition of the first aspect comprises, consists of, or consists essentially of water, TMAH, and HEDP. In another preferred embodiment, the composition of the first aspect comprises, consists of, or consists essentially of water, TMAH, HEDP, and hydrogen peroxide. In still another preferred embodiment, the composition of the first aspect comprises, consists of, or consists essentially of water, CDTA, hydrogen peroxide, at least one etchant, and at least one corrosion inhibitor, wherein the at least one etchant comprises a species selected from the group consisting of KOH, THEMAH, choline hydroxide, and a mixture of KOH and choline hydroxide, and the at least one corrosion inhibitor comprises a species selected from the group consisting of mBTA, 3-ATA, and TAZ.

It will be appreciated that it is common practice to make concentrated forms of the compositions to be diluted prior to use. For example, the composition may be manufactured in a more concentrated form and thereafter diluted with at least one solvent at the manufacturer, before use, and/or during use at the fab. Dilution ratios may be in a range from about 0.1 part diluent:1 part composition concentrate to about 100 parts diluent:1 part composition concentrate. It should further be appreciated that the compositions described herein include oxidizing agents, which can be unstable over time. Accordingly, the concentrated form can be substantially devoid of oxidizing agent(s) and the oxidizing agent can be introduced to the concentrate or the diluted composition by the manufacturer before use and/or during use at the fab.

The compositions described herein are easily formulated by simple addition of the respective ingredients and mixing to homogeneous condition. Furthermore, the compositions may be readily formulated as single-package formulations or multi-part formulations that are mixed at or before the point of use, preferably multi-part formulations. The individual parts of the multi-part formulation may be mixed at the tool or in a mixing region/area such as an inline mixer or in a storage tank upstream of the tool. It is contemplated that the various parts of the multi-part formulation may contain any combination of ingredients/constituents that when mixed together form the desired composition. The concentrations of the respective ingredients may be widely varied in specific multiples of the composition, i.e., more dilute or more concentrated, and it will be appreciated that the compositions can variously and alternatively comprise, consist or consist essentially of any combination of ingredients consistent with the disclosure herein.

Accordingly, a second aspect relates to a kit including, in one or more containers, one or more components adapted to form the compositions described herein. For example, the compositions can be separated such that all of the components are included in one container, except for the at least one oxidizing agent, for combination with the oxidizing agent and/or additional solvent(s) prior to or during use. The containers of the kit must be suitable for storing and shipping said removal composition components, for example, NOWPak® containers (Advanced Technology Materials, Inc., Danbury, Conn., USA). The one or more containers which contain the components of the composition preferably include means for bringing the components in said one or more containers in fluid communication for blending and dispense. For example, referring to the NOWPak® containers, gas pressure may be applied to the outside of a liner in said one or more containers to cause at least a portion of the contents of the liner to be discharged and hence enable fluid communication for blending and dispense. Alternatively, gas pressure may be applied to the head space of a conventional pressurizable container or a pump may be used to enable fluid communication. In addition, the system preferably includes a dispensing port for dispensing the blended composition to a process tool.

Substantially chemically inert, impurity-free, flexible and resilient polymeric film materials, such as high density polyethylene, are preferably used to fabricate the liners for said one or more containers. Desirable liner materials are processed without requiring co-extrusion or barrier layers, and without any pigments, UV inhibitors, or processing agents that may adversely affect the purity requirements for components to be disposed in the liner. A listing of desirable liner materials include films comprising virgin (additive-free) polyethylene, virgin polytetrafluoroethylene (PTFE), polypropylene, polyurethane, polyvinylidene chloride, polyvinylchloride, polyacetal, polystyrene, polyacrylonitrile, polybutylene, and so on. Preferred thicknesses of such liner materials are in a range from about 5 mils (0.005 inch) to about 30 mils (0.030 inch), as for example a thickness of 20 mils (0.020 inch).

Regarding the containers for the kits, the disclosures of the following patents and patent applications are hereby incorporated herein by reference in their respective entireties: U.S. Pat. No. 7,188,644 entitled "APPARATUS AND METHOD FOR MINIMIZING THE GENERATION OF PARTICLES IN ULTRAPURE LIQUIDS;" U.S. Pat. No. 6,698,619 entitled "RETURNABLE AND REUSABLE, BAG-IN-DRUM FLUID STORAGE AND DISPENSING CONTAINER SYSTEM;" and PCT/US08/63276 entitled "SYSTEMS AND METHODS FOR MATERIAL BLENDING AND DISTRIBUTION" filed on May 9, 2008.

In a third aspect, the invention relates to methods of etching titanium nitride material from the surface of the microelectronic device having same thereon using the composition of the first aspect, as described herein. For example, titanium nitride material may be removed without substantially damaging/removing metal conductor and insulator materials that are present on the microelectronic device. Accordingly, in a preferred embodiment, a method of selectively and substantially removing titanium nitride and/or photoresist etch residue materials relative to metal conductor and insulator materials from the surface of the microelectronic device having same thereon is described using the composition of the first aspect as described herein. In another preferred embodiment, a method of selectively and substantially removing titanium nitride and/or photoresist etch residue materials relative to metal conductor (e.g., copper), cobalt, ruthenium and insulator materials from the surface of the microelectronic device having same thereon is described using the composition of the first aspect described herein.

In etching applications, the composition is applied in any suitable manner to the surface of the microelectronic device having the titanium nitride and/or photoresist etch residue material thereon, e.g., by spraying the composition on the surface of the device, by dipping (in a static or dynamic volume of the composition) of the device including the titanium nitride and/or photoresist etch residue material, by contacting the device with another material, e.g., a pad, or fibrous sorbent applicator element, that has the composition absorbed thereon, by contacting the device including the titanium nitride and/or photoresist etch residue material with a circulating composition, or by any other suitable means, manner or technique, by which the composition is brought into removal contact with the titanium nitride and/or photoresist etch residue material. The application may be in a batch or single wafer apparatus, for dynamic or static cleaning. Advantageously, the compositions described herein, by virtue of their selectivity for titanium nitride and/or photoresist etch residue material relative to other materials that may be present on the microelectronic device structure and exposed to the composition, such as metals and insulating materials (i.e., low-k dielectrics), achieve at least partial removal of the titanium nitride and/or photoresist etch residue material in a highly efficient and highly selective manner.

In use of the compositions of the first aspect for removing titanium nitride and/or photoresist etch residue material from microelectronic device structures having same thereon, the composition typically is contacted with the device structure in a single wafer tool for a sufficient time of from about 0.3 minute to about 60 minutes, preferably about 0.5 minutes to about 30 minutes, at temperature in a range of from about 20° C. to about 100° C., preferably about 30° C. to about 70° C. Such contacting times and temperatures are illustrative, and any other suitable time and temperature conditions may be employed that are efficacious to at least partially remove the titanium nitride and/or photoresist etch residue material from the device structure. For example, preferably for titanium nitride etching, the contact time is about 0.5 to 3 min at temperature in a range from about 40° C. to about 60° C.

In one embodiment, the composition is heated inline during delivery to the device structure. By heating inline, rather than in the bath itself, the composition life increases.

Following the achievement of the desired etching action, the composition can be readily removed from the microelectronic device to which it has previously been applied, e.g., by rinse, wash, or other removal step(s), as may be desired and efficacious in a given end use application of the compositions described herein. For example, the device may be rinsed with a rinse solution including deionized water and/or dried (e.g., spin-dry, $N_2$, vapor-dry etc.).

The compositions of the first aspect preferably selectively etch titanium nitride material relative to metal conductor and insulating (i.e., low-k dielectric) materials. In one embodiment, the etch rate of titanium nitride is high (upwards of 500 Å $min^{-1}$, preferably upwards of about 350 Å $min^{-1}$ at 50° C. and upwards of about 500 Å $min^{-1}$ at 60° C., while the etch rate of metal is low (about 0.01 to about 10 Å $min^{-1}$, preferably about 0.1 to about 5 Å $min^{-1}$) and the etch rate of low-k dielectric is low (about 0.01 to about 10 Å $min^{-1}$, preferably about 0.01 to about 5 Å $min^{-1}$).

A fourth aspect of the invention relates to the improved microelectronic devices made according to the methods described herein and to products containing such microelectronic devices.

A fifth aspect relates to methods of manufacturing an article comprising a microelectronic device, said method comprising contacting the microelectronic device with a composition for sufficient time to etchingly remove titanium nitride and/or photoresist etch residue material from the surface of the microelectronic device having same thereon, and incorporating said microelectronic device into said article, wherein the composition comprises, consists of or consists essentially of at least one oxidizing agent, at least one etchant, at least one metal corrosion inhibitor, and at least one solvent. In still another alternative, the composition comprises, consists of, or consists essentially of at least one oxidizing agent, at least one etchant, at least one chelating agent, and at least one solvent. The composition may further comprise, consist of or consist essentially of titanium nitride material.

A sixth aspect of the invention relates to an article of manufacture comprising, consisting of or consisting essentially of a microelectronic device substrate, a titanium nitride layer on said substrate, and a composition described herein.

The features and advantages of the invention are more fully shown by the illustrative examples discussed below.

Example 1

A concentrate comprising about 1 to about 10 wt % TMAH and about 0.01 to about 1 wt % chelating agent, was diluted with about 50 to about 95 wt % $H_2O_2$ (30%), wherein the chelating agents included CDTA, EDTA-2NH₃ (ethylenediaminetetraacetic acid diammonium salt), EDTMPA, DTPA, HEDP and NTMP (50%). The etch rates of PETEOS and TiN as well as the total cobalt loss were determined at 50° C. Depending on the chelating agent and the amount, the PETEOS etch rate was less than about 0.3 Å over 30 minutes, the TiN etch rate was greater than 500 Å/min, and the Co loss at 5 minutes was in a range from about 1 Å to about 45 Å. When the chelating agent was HEDP or DTPA, the Co loss at 5 minutes was less than about 10 Å.

A concentrate comprising about 1 to about 10 wt % TMAH and either HEDP or DTPA, was diluted with about 50 to about 95 wt % $H_2O_2$ (30%), wherein the amount of HEDP or DTPA was 0.05 wt %, 0.1 wt %, 0.15 wt %, 0.2 wt %, and 0.25 wt % in the concentrate. In each case, the TiN etch rate was approximately the same (800-860 Å/min) and the Co loss at 5 minutes was less than about 10 Å.

Example 2

A concentrate comprising about 1 to about 10 wt % TMAH, about 0.01 to about 0.05 wt % CDTA, and about 0.1 to about 2.5 wt % corrosion inhibitor were diluted with about 50 to about 95 wt % $H_2O_2$ (30%), wherein the corrosion inhibitor included 5-mBTA, 3-ATA/SDS, 3-ATA, succinimide, uric acid, MBI, adenosine, benzothiazole, 5-ATA, Tween 80, Tween 40, Tween 20 and DDPA/Tween-80. The etch rates of PETEOS and TiN as well as the total cobalt loss were determined at 50° C. Depending on the corrosion inhibitor and the amount, the PETEOS etch rate was less than about 0.3 Å over 30 minutes, the TiN etch rate was greater than 500 Å/min, and the Co loss at 5 minutes was in a range from about 2 Å to about 32 Å, and Cu loss at 20 minutes was less than 20 Å.

A concentrate comprising about 1 to about 10 wt % TMAH, about 0.01 to about 0.05 wt % DDPA, and about 0.1 to about 5 wt % of a second corrosion inhibitor, was diluted with about 50 to about 95 wt % $H_2O_2$ (30%), wherein the second corrosion inhibitor included Tween-80, Tween 40, Tween 20, Pluronic L31, Pluronic 31R1, Pluronic 25R2 and Pluronic 25R4. In each case, the TiN etch rate was approximately the same (800-860 Å/min) and the Co loss at 5 minutes was less than about 12 Å, and the Cu loss at 20 minutes was less than about 12 Å.

Example 3

A concentrate comprising 5-10 wt % TMAH, 0.001-0.2 wt % CDTA, 0.01-1 wt % mBTA, balance water was prepared. Semi-aqueous formulations were prepared by combining 10 wt % of the concentrate, with 10 wt % of organic solvent, and 80 wt % $H_2O_2$ (30%), wherein the organic solvent included diethylene glycol monoethyl ether, diethylene glycol monobutyl ether, dimethyl sulfoxide, sulfolane, triethylene glycol dimethyl ether, tetrahydrofurfuryl alcohol, DPGME, propylene glycol, ethylene glycol, 1,2-butanediol, 1,4-butanediol, hexylene glycol, tetramethyl urea, choline bicarbonate, and propylene carbonate. The etch rates of PETEOS, TiN, Cu and SiON were determined at 50° C., wherein the process time for TiN was 30 seconds and the process time for PETEOS, Cu and SiON was 30 minutes. For all of the formulations, the PETEOS and SiON etch rates were less than 0.5 Å, the Cu etch rates were less than 0.5 Å, with the exception of when choline bicarbonate or propylene carbonate were used. All had TiN etch rates greater than 210 Å/min, with the exception of when diethylene glycol monoethyl ether was used.

Semi-aqueous formulations were prepared by combining 10 wt % of the concentrate, with 40 wt % of organic solvent, and 50 wt % $H_2O_2$ (30%), wherein the organic solvent included diethylene glycol monoethyl ether, diethylene glycol monobutyl ether, dimethyl sulfoxide, sulfolane, triethylene glycol dimethyl ether, tetrahydrofurfuryl alcohol, DPGME, propylene glycol, ethylene glycol, 1,2-butanediol, 1,4-butanediol, hexylene glycol, tetramethyl urea, choline bicarbonate, and propylene carbonate. The etch rates of PETEOS, TiN, Cu and SiON were determined at 50° C., wherein the process time for TiN was 30 seconds and the process time for PETEOS, Cu and SiON was 30 minutes. For all of the formulations, the PETEOS and SiON etch rates were less than 0.5 Å, the Cu etch rates were less than 0.5 Å, with the exception of when choline bicarbonate or propylene carbonate were used. In general, the TiN etch rates were not as high when a larger quantity of organic solvent was used, with the exception of 1,2-butanediol and hexylene glycol.

Example 4

Concentrates comprising about 1 to about 10 wt % KOH, about 1 wt % to about 10 wt % stabilized choline hydroxide (, about 0.01 to about 1 wt % CDTA, and about 0.1 wt % to about 10 wt % corrosion inhibitor, wherein the corrosion inhibitors included mBTA, TAZ or 3-ATA, were prepared. The concentrate was diluted by combining 1 part of the concentrate with 9 parts hydrogen peroxide (30%). The etch rates of Black Diamond low-k dielectric, Cu, Co, and SiN were determined at 60° C. The etch rate of TiN was determined at 30 sec at 50° C. In each case, the low-k dielectric etch rate was less than about 0.5 Å/min, the SiN etch rate was about 1 Å/min, the TiN etch rate was greater than 250 Å/min. The Co etch rate was less than about 0.5 Å/min when the corrosion inhibitor was TAZ or 3-ATA. When the corrosion inhibitor was 3-ATA, the Cu etch rate was less than 0.5 Å/min.

Example 5

Concentrates comprising about 1 wt % to about 10 wt % of at least one etchant, about 0.01 to about 1 wt % CDTA, and about 0.01 wt % to about 1 wt % mBTA, were prepared, wherein the at least one etchant included TPAH, BTEAH, DEDMAH, or THEMAH. The concentrate was diluted by combining 1 part of the concentrate with 9 parts hydrogen peroxide (30%). The etch rates of Black Diamond low-k dielectric, Cu, Co, and SiN were determined at 60° C. The etch rate of TiN was determined at 30 sec at 50° C. In each case, the low-k dielectric etch rate was less than about 1 Å/min (with the solutions including BTEAH, THEMAH and DEDMAH being less than 0.5 Å/min), the SiN etch rate was less than about 0.8 Å/min, the TiN etch rate was greater than 200 Å/min, the Cu etch rate was less than about 1 Å/min (with the exception of the solution comprising THEMAH), and the Co etch rate was less than about 0.5 Å/min (with the exception of the solution comprising THEMAH).

Example 6

A concentrate comprising about 1 wt % to about 10 wt % KOH, about 0.01 to about 1 wt % CDTA, and about 0.01 wt % to about 1 wt % TAZ, were prepared. The concentrate was diluted by combining 1 part of the concentrate with 9 parts hydrogen peroxide (30%). The etch rates of Black Diamond low-k dielectric, Cu, and Co were determined at 60° C. The etch rate of TiN was determined at 30 sec at 50° C. The low-k dielectric etch rate was less than about 0.5 Å/min, the TiN etch rate was greater than about 250 Å/min, the Cu etch rate was less than about 1 Å/min, and the Co etch rate was less than about 1 Å/min.

While the invention has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

What is claimed is:

1. A composition comprising from about 15 wt % to about 30 wt % of at least one oxidizing agent, from about 0.01 wt % to about 15 wt % of at least one etchant, from about 0.01 wt % to about 2 wt % of at least one metal corrosion inhibitor, from about 0.01 wt % to about 1 wt % of at least one chelating agent, and at least one solvent, wherein:
the etchant comprises a species selected from the group consisting of tetramethylammonium hydroxide (TMAH), tetraethylammonium hydroxide (TEAH), tetrapropylammonium hydroxide (TPAH), tetrabutylammonium hydroxide (TBAH), benzyltrimethylammonium hydroxide (BTMAH), potassium hydroxide, ammonium hydroxide, benzyltriethylammonium hydroxide (BTEAH), tetrabutylphosphonium hydroxide (TBPH), (2-hydroxyethyl)trimethylammonium hydroxide, (2-hydroxyethyl)triethylammonium hydroxide, (2-hydroxyethyl)tripropylammonium hydroxide, (1-hydroxypropyl)trimethylammonium hydroxide, ethyltrimethylammonium hydroxide, diethyldimethylammonium hydroxide (DEDMAH), tris(2-hydroxyethyl)methyl ammonium hydroxide (THEMAH), 1,1,3,3-tetramethylguanidine (TMG), guanidine carbonate, arginine, and combinations thereof;
the corrosion inhibitor comprises a species selected from the group consisting of 2-amino-5-ethyl-1,3,4-thiadiazole, ATA-SDS, Ablumine O, 2-benzylpyridine, decyltrimethylammonium chloride (DTAC), carbazole, saccharin, benzoin oxime, polyoxypropylene/polyoxyethylene block copolymer, sodium dodecylbenzenesulfonate (SDS), benzylphosphonic acid, diphenylphosphinic acid, 1,2-ethylenediphosphonic acid, phenylphosphonic acid, cinnamic acid, and combinations thereof; and
wherein the composition has a pH in a range of from about 6 to about 10; and
wherein the composition removes titanium nitride and/or photoresist etch residue from a surface of a microelectronic device having the same thereon and wherein the composition is highly selective to cobalt.

2. The composition of claim 1, wherein the etchant comprises TMAH, choline hydroxide, potassium hydroxide, THEMAH, and any combination thereof.

3. The composition of claim 1, wherein the oxidizing agent comprises a species selected from the group consisting of hydrogen peroxide, FeCl3, FeF3, Fe(NO3)3, Sr(NO3)2, CoF3, MnF3, oxone (2KHSO5.KHSO4.K2SO4), periodic acid, iodic acid, vanadium (V) oxide, vanadium (IV, V) oxide, ammonium vanadate, ammonium peroxomonosulfate, ammonium chlorite (NH4ClO2), ammonium chlorate (NH4ClO3), ammonium iodate (NH4IO3), ammonium nitrate (NH4NO3), ammonium perborate (NH4BO3), ammonium perchlorate (NH4ClO4), ammonium periodate (NH4IO3), ammonium persulfate ((NH4)2S2O8), ammonium hypochlorite (NH4ClO), ammonium tungstate ((NH4)10H2(W2O7)), sodium persulfate (Na2S2O8), sodium hypochlorite (NaClO), sodium perborate, potassium iodate (KIO3), potassium permanganate (KMnO4), potassium persulfate, nitric acid (HNO3), potassium persulfate (K2S2O8), potassium hypochlorite (KClO), tetramethylammonium chlorite ((N(CH3)4)ClO2), tetramethylammonium chlorate ((N(CH3)4)ClO3), tetramethylammonium iodate ((N(CH3)4)IO3), tetramethylammonium perborate ((N(CH3)4)BO3), tetramethylammonium perchlorate ((N(CH3)4)ClO4), tetramethylammonium periodate ((N(CH3)4)IO4), tetramethylammonium persulfate ((N(CH3)4)S2O8), tetrabutylammonium peroxomonosulfate, peroxomonosulfuric acid, ferric nitrate (Fe(NO3)3), urea hydrogen peroxide ((CO(NH2)2)H2O2), peracetic acid (CH3(CO)OOH), 1,4-benzoquinone, toluquinone, dimethyl-1,4-benzoquinone, chloranil, alloxan, N-methylmorpholine N-oxide, trimethylamine N-oxide, and combinations thereof.

4. The composition of claim 1, wherein the oxidizing agent comprises hydrogen peroxide.

5. The composition of claim 1, wherein the at least one solvent comprises a species selected from the group consisting of water, methanol, ethanol, isopropanol, butanol, pentanol, hexanol, 2-ethyl-1-hexanol, heptanol, octanol, ethylene glycol, propylene glycol, butylene glycol, hexylene glycol, butylene carbonate, ethylene carbonate, propylene carbonate, choline bicarbonate, dipropylene glycol, dimethylsulfoxide, sulfolane, tetrahydrofurfuryl alcohol (THFA), 1,2-butanediol, 1,4-butanediol, tetramethyl urea, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether, triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether (TPGME), dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, 2,3-dihydrodecafluoropentane, ethyl perfluorobutylether, methyl perfluorobutylether, alkyl carbonates, 4-methyl-2-pentanol, and combinations thereof.

6. The composition of claim 1, wherein the at least one solvent comprises water.

7. The composition of claim 1, wherein the metal corrosion inhibitor comprises one or more species selected from the group consisting of ATA-SDS, polyoxyethylene (20) sorbitan monooleate, polyoxyethylene (20) sorbitan monopalmitate, polyoxyethylene (20) sorbitan monolaurate, polyoxypropylene/polyoxyethylene block copolymers, DTAC, and combinations thereof.

8. The composition of claim 1, wherein the at least one chelating agent comprises a species selected from the group consisting of acetylacetonate, 1,1,1-trifluoro-2,4-pentanedione, 1,1,1,5,5,5-hexafluoro-2,4-pentanedione, glycine, serine, proline, leucine, alanine, asparagine, aspartic acid, glutamine, valine, and lysine, iminodiacetic acid (IDA), malonic acid, oxalic acid, succinic acid, boric acid, nitrilotriacetic acid, malic acid, citric acid, acetic acid, maleic acid, ethylenediaminetetraacetic acid (EDTA), ethylenediaminetetraacetic acid diammonium salt, (1,2-cyclohexylenedinitrilo)tetraacetic acid (CDTA), diethylenetriamine pentaacetic acid (DTPA), 2-phosphonobutane-1,2,4-tricarboxylic acid (PBTCA), ethylendiamine disuccinic acid, propylenediamine tetraacetic acid, phosphonic acid, hydroxyethylidene diphosphonic acid (HEDP), 1-hydroxyethane-1,1-diphosphonic acid, nitrilo-tris(methylenephosphonic acid) (NTMP), amino tri(methylene phosphonic acid), diethylenetriamine penta(methylene phosphonic acid), ethylenediamine tetra(methylene phosphonic acid) (EDTMPA), ethylenediamine, 2,4-pentanedione, benzalkonium chloride, 1-imidazole, tetraglyme, pentamethyldiethylenetriamine (PMDETA), 1,3,5-triazine-2,4,6-thithiol trisodium salt solution, 1,3,5-triazine-2,4,6-thithiol triammonium salt solution, sodium diethyldithiocarbamate, disubstituted dithiocarbamates, sulfanilamide, monoethanolamine (MEA), 2-hydroxypyridine 1-oxide, sodium triphosphate penta basic, and combinations thereof.

9. The composition of claim 1, wherein the at least one chelating agent comprises CDTA.

10. The composition of claim 1, wherein the at least one chelating agent comprises a species selected from the group consisting of ammonium cation or a tetraalkylammonium cation of acetate, chloride, bromide, iodide, sulfate, benzoate, propionate, citrate, formate, oxalate, tartarate, succinate, lactate, maleate, malonate, fumarate, malate, ascorbate, mandelate, and phthalate, and combinations thereof.

11. The composition of claim 1, wherein the at least one chelating agent comprises ammonium bromide and/or ammonium chloride.

12. The composition of claim 1, further comprising at least one additional component selected from the group consisting of at least one surfactant, at least one low-k passivating agent, and combinations thereof.

13. The composition of claim 1, wherein the composition is substantially devoid of, silicates, abrasive materials, metal halides, and combinations thereof.

14. A method of etching titanium nitride material from a surface of a microelectronic device having same thereon, said method comprising contacting the surface with a composition, wherein the composition comprising from about 15 wt % to about 30 wt % of at least one oxidizing agent, from about 0.01 wt % to about 15 wt % of at least one etchant, from about 0.01 wt % to about 2 wt % of at least one metal corrosion inhibitor, from about 0.01 wt % to about 1 wt % of at least one chelating agent, and at least one solvent, wherein:

the etchant comprises a species selected from the group consisting of tetramethylammonium hydroxide (TMAH), tetraethylammonium hydroxide (TEAH), tetrapropylammonium hydroxide (TPAH), tetrabutylammonium hydroxide (TBAH), benzyltrimethylammonium hydroxide (BTMAH), potassium hydroxide, ammonium hydroxide, benzyltriethylammonium hydroxide (BTEAH), tetrabutylphosphonium hydroxide (TBPH), (2-hydroxyethyl)trimethylammonium hydroxide, (2-hydroxyethyl)triethylammonium hydroxide, (2-hydroxyethyl)tripropylammonium hydroxide, (1-hydroxypropyl)trimethylammonium hydroxide, ethyltrimethylammonium hydroxide, diethyldimethylammonium hydroxide (DEDMAH), tris(2-hydroxyethyl)methyl ammonium hydroxide (THEMAH), 1,1,3,3-tetramethylguanidine (TMG), guanidine carbonate, arginine, and combinations thereof;

the metal corrosion inhibitor comprises a species selected from the group consisting of 2-amino-5-ethyl-1,3,4-thiadiazole, ATA-SDS, Ablumine P, 2-benzylpyridine, decyltrimethylammonium chloride (DTAC), carbazole, saccharin, benzoin oxime, polyoxypropylene/polyoxyethylene block copolymer, sodium dodecylbenzenesulfonate (SDS), benzylphosphonic acid, diphenylphosphinic acid, 1,2-ethylenediphosphonic acid, phenylphosphonic acid, cinnamic acid, and combinations thereof; and wherein the composition has a pH in a range of from about 6 to about 10; wherein the composition removes titanium nitride and/or photoresist etch residue from a surface of a microelectronic device having the same thereon and wherein the composition is highly selective to cobalt.

15. The method of claim 14, wherein the contacting comprises time in a range from about 0.3 minute to about 30 minutes at temperature in a range of from about 20° C. to about 100° C.

16. The method of claim 14, wherein the composition is rinsed from the surface following the desired etching action.

* * * * *